United States Patent [19]

Yokoyama

[11] Patent Number: 4,504,793
[45] Date of Patent: Mar. 12, 1985

[54] PULSE-WIDTH MODULATION CIRCUIT
[75] Inventor: Kenji Yokoyama, Hamamatsu, Japan
[73] Assignee: Nippon Gakki Seizo Kabushiki Kaisha, Japan
[21] Appl. No.: 455,497
[22] Filed: Jan. 4, 1983
[30] Foreign Application Priority Data
Jan. 29, 1982 [JP]  Japan .................................. 57-12632
[51] Int. Cl.³ ............................................ H03F 3/38
[52] U.S. Cl. ..................................................... 330/10
[58] Field of Search ...................... 330/10, 207 A, 251
[56] References Cited
U.S. PATENT DOCUMENTS
4,059,807  1/1977  Hamada ........................... 330/207 A Primary Examiner—James B. Mullins
Attorney, Agent, or Firm—Kane, Dalsimer, Kane, Sullivan and Kurucz

[57] ABSTRACT

A pulse-width modulation circuit is provided which is simple in circuit construction and is free from the non-linearity of a waveform of a carrier signal. The pulse-width modulation circuit comprises an operational amplifier, a comparator and a feedback circuit. The amplifier has inverting and non-inverting input terminals and an output terminal with a capacitor connected between the inverting and output terminals. An input signal to be pulse-width modulated is applied to either one of the inverting and non-inverting input terminals depending upon whether the amplifier is used as inverting or non-inverting amplifier with respect to the input signal. The output from the amplifier is applied to one input terminal of the comparator, to the other input terminal of which a carrier signal, such as a sawtooth wave, a triangular wave, a sinusoidal wave, or other various periodic waves, is applied for the comparison with the input signal. The comparator output is fed back to the inverting input terminal of the amplifier via the feedback circuit. Since the carrier signal is applied to the pulse-width modulation circuit within the feedback loop, the non-linearity of the carrier signal itself gives no adverse effect upon the modulated output from the comparator.

7 Claims, 11 Drawing Figures

PULSE-WIDTH MODULATION CIRCUIT

BACKGROUND OF THE INVENTION (a) Field of the Invention

This invention relates to a pulse-width modulation circuit which may be used for the effective amplification of such as audio signals, and more particularly it relates to a pulse-width modulation circuit which is independent of and free from the non-linearity of a waveform of a carrier signal.

(b) Description of the Prior Art

It is known in the art that an audio signal amplifier can obtain an extra high efficiency by associating a pulse-width modulation circuit therewith. FIG. 1 shows a circuit diagram of one example of such conventional audio signal amplifiers. In the figure, a pulse-width modulation circuit designated by a reference number 1 converts an audio signal to be amplified into a pulse signal having a duty ratio corresponding to the amplitude of the audio signal. The pulse-width modulation circuit 1 comprises a comparator 2 having inverting and non-inverting input terminals. The non-inverting input terminal receives an audio signal Ea (voltage signal) to be amplified via an input terminal 3, while the inverting input terminal receives via an input terminal 4 a carrier signal Ec (voltage signal), such as of a triangular wave, a sawtooth wave or the like, which is necessary for effecting a pulse-width modulation. When the audio and carrier signals Ea and Ec having respectively waveforms as shown in FIG. 2(a) are applied to the input terminals of the pulse-width modulation circuit 1, a pulse signal Ep with a waveform as shown in FIG. 2(b) is generated, having an equal period or repetition frequency to that of the carrier signal Ec and a duty ratio varying in correspondence with the amplitude of the audio signal Ea. The pulse signal Ep is then power-amplified in a pulse amplifier 5, and thereafter is subjected to demodulation in a low-pass filter 6 wherein the carrier and audio signals Ec and Ea are discriminated to deliver only the components of the audio signal Ea to a loudspeaker 7.

In the prior art pulse-width modulation circuit 1 of FIG. 1, as readily understood from the illustration of FIG. 2, substantially large distortion may develop unless the slope of the waveform of the carrier signal Ec, such as a triangular wave or a sawtooth wave, varies linearly with time, that is, unless the duty ratio of the pulse signal Ep varies exactly in proportion to the amplitude of the input signal Ea. However, practically, it is very hard to produce a correct linear slope for the triangular and saw-tooth waves.

In order to obviate such a hardship accompanied by the pulse-width modulation circuit described above, another type of a pulse-width modulation circuit has been proposed heretofore, as shown in FIG. 3.

Referring to FIG. 3, a pulse-width modulation circuit 1 comprises an operational amplifier 8, a comparator 9, and a pulse amplifier 10. An audio signal Ea is supplied through an input terminal 3 to a non-inverting input terminal of the operational amplifier 8, and a carrier signal Ec of a square wave is supplied through an input terminal 4 and a resistor 11 to an inverting input terminal of the operational amplifier 8. The operational amplifier 8, of a Miller integration circuit arrangement with the resistor 11 and a capacitor 12, integrates the carrier signal Ec (square wave) to generate a triangular wave, the audio signal Ea being added to the triangular wave. As a result, an output signal E1 of the operational amplifier 8 is generated, having a waveform as exemplarily illustrated in FIG. 4(a). The signal E1 is then applied to a non-inverting input terminal of the comparator 9 so as to be compared with a ground level. The comparator 9 outputs a pulse signal Ep as of FIG. 4(b), the pulse signal having an equal period to that of the carrier signal Ec and a duty ratio corresponding to the amplitude of the audio signal Ea. The pulse signal Ep, after being subjected to non-inverting amplification in the pulse amplifier 10, is negative-fed back to the inverting input terminal of the operational amplifier 8 through a resistor 13. The output of the pulse-width modulation circuit 1, and hence the output of the pulse amplifier 10, is demodulated by a low-pass filter 6 to drive a loudspeaker 7.

As appreciated from the pulse-width modulation circuit 1 of FIG. 3, a negative feedback is given to a portion of the integrated carrier signal (triangular wave) and also to the audio signal Ea, so that a modulated output with lesser distortion can be obtained than the pulse-width modulation circuit 1 of FIG. 1. The carrier signal Ec is applied to the pulse-width modulation circuit 1 of FIG. 3, however, can not share in the benefit of a negative feedback. More in particular in this case, if the carrier signal Ec (square signal) itself has distortions resulting from such as residual noises, distorted square waveforms, or symmetrical amplitudes, this kind of distortions are amplified and developed at the output of the pulse-width modulation circuit 1. Consequently, it is necessary to provide such a carrier signal Ec as having no distortion. However, it is most difficult to fabricate an oscillator circuit generating a distortionless carrier signal.

SUMMARY OF THE INVENTION

It is therefore a primary object of the invention to provide a pulse-width modulation circuit wherein non-linear distortion of the carrier signal has no adverse effect upon the modulated output.

It is a further object of the invention to provide a pulse-width modulation circuit as above which can obtain a modulated output with a remarkedly low distortion, regardless of a simple construction of the circuitries and of the employment of such carrier signals as commonly available in the fields of electronics.

In a preferred example of the present invention which will be described in detail hereinunder, the pulse-width modulation circuit by which an input signal is pulse-width modulated by means of a carrier signal comprises: first amplifier means having inverting and non-inverting input terminals and a first output terminal, the input signal being applied to either one of the inverting and non-inverting input terminals; capacitor means connected between the output and inverting input terminals; comparator means having first and second input terminals and a second output terminal, an output signal from the first amplifier means being applied to the first input terminal and the carrier signal being applied to the second input terminal, the comparator means comparing the output signal from the first amplifier means with the carrier signal to deliver at the second output terminal a pulse signal; and feedback circuit means for feeding back the pulse signal from the comparator means to the inverting input terminal of the first amplifier means, wherein the pulse signal is a pulse-width modulated signal of the input signal.

DETAILED DESCRIPTION OF THE PREFERRED EMBODIMENTS

Figure 1:
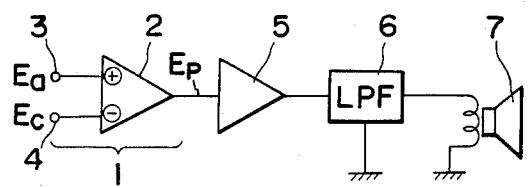
FIGS. 1 and 3 are schematic circuit diagrams of prior art typical pulse-width modulation circuits applied to audio signal amplifiers.
Figure 2:
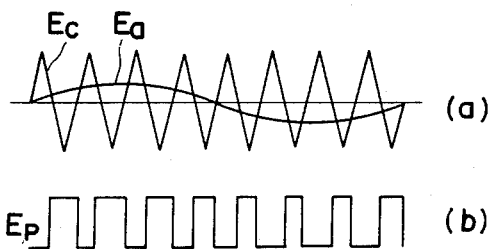
FIGS. 2 and 4 show waveforms of audio, carrier, and output signals illustrating the operations of the pulse-width modulation circuits of FIGS. 1 and 3, respectively.
Figure 3:
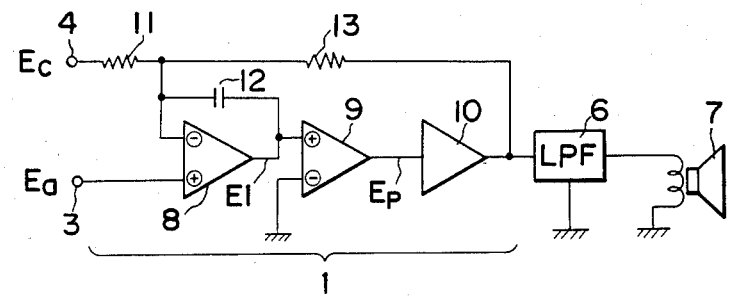
Figure 4:
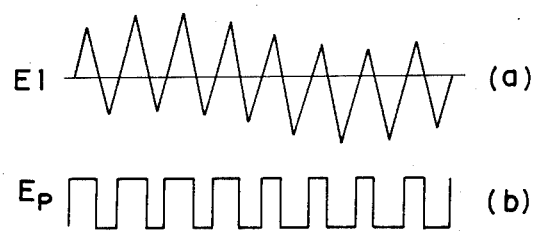
Figure 5:
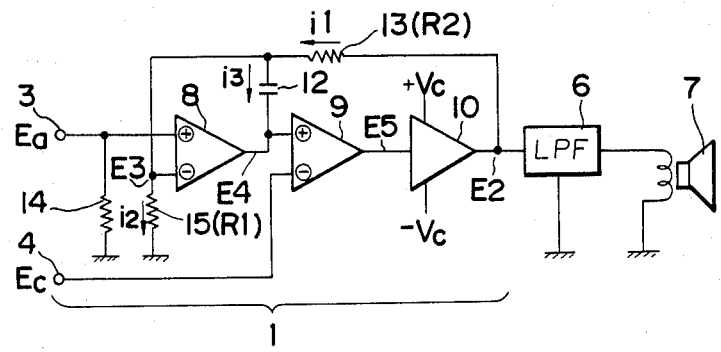
FIG. 5 is a schematic circuit diagram of a first embodiment of the pulse-width modulation circuit according to the invention, which is applied to an audio signal amplifier.
Figure 6:
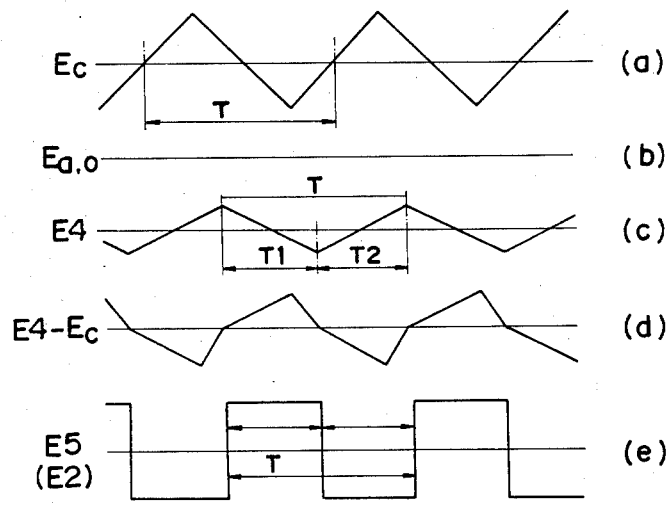
FIGS. 6, 7, and 8 show waveforms illustrating the operations of the circuit of FIG. 5, on condition that an audio input signal is at ground, positive, and negative levels, respectively.
Figure 7:
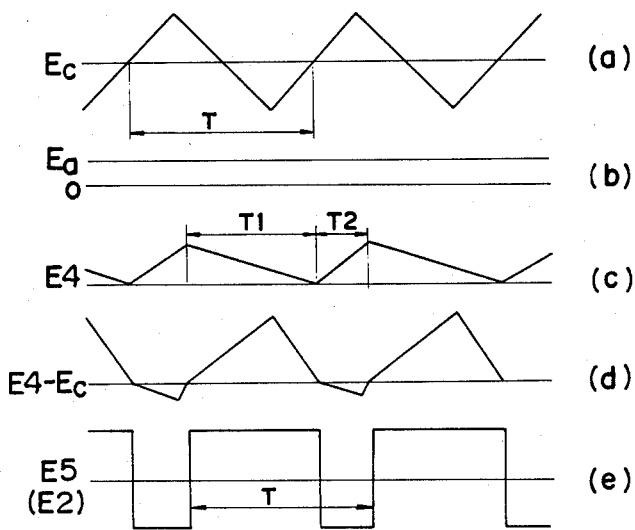
Figure 8:
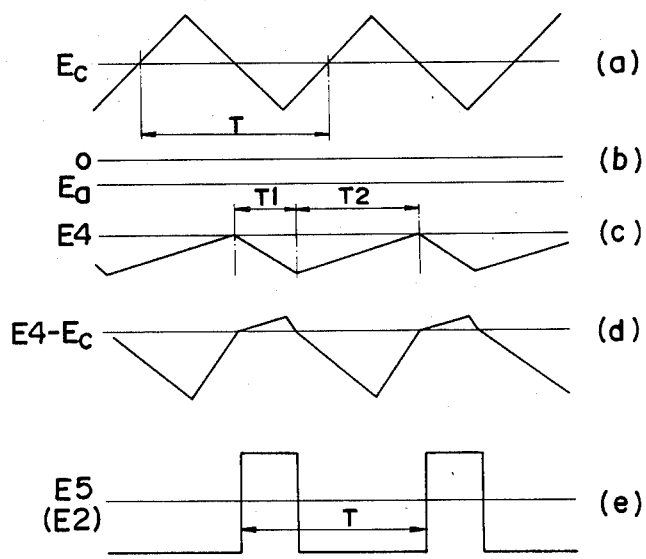

FIG. 5 shows a schematic circuit diagram illustrating a first embodiment of the pulse-width modulation circuit according to the invention, which is applied to an audio signal amplifier.

In FIG. 5, a pulse-width modulation circuit is designated generally by a reference number 1, and comprises an operational amplifier 8, a comparator 9, and a pulse amplifier 10. An audio signal Ea (input voltage signal) to be pulse-width modulated and a carrier signal Ec (voltage signal) required for the pulse-width modulation are applied to the pulse-width modulation circuit 1 through input terminals 3 and 4, respectively. A more detailed description with respect to particular circuit connections are given in the following. The input terminal 3 is connected to the non-inverting input terminal of the operational amplifier 8 and to ground through a resistor 14, while the inverting input terminal is connected to ground through a resistor 15 (a resistance value of R1) and to the output terminal of the operational amplifier 8 through a capacitor 12. The output terminal of the amplifier 8 is connected to a non-inverting input terminal of the comparator 9, an inverting input terminal of which is connected to the input terminal 4. An output terminal of the comparator 9 is connected to an input terminal of the pulse amplifier 10 (non-inverting amplifier), and an output terminal of the pulse amplifier 10 is connected to the inverting input terminal of the operational amplifier 8 through a resistor 13 (a resistance value of R2). The output of the pulse amplifier 10 is coupled to a low-pass filter 6 which functions to demodulate the output (modulated output) from the pulse amplifier 10, so that the audio signal Ec and the carrier signal Ec are discriminated from each other. The demodulated output from the low-pass filter 6 is then supplied to a loudspeaker 7.

The operation of the pulse-width modulation circuit 1 thus constructed will be described in connection with the waveforms shown in FIGS. 6 to 9 which are plotted along common time axes in each of the figures.

An output signal (voltage signal) E2 of the pulse amplifier 10 is a pulse having voltages $+Vc$ and $-Vc$ respectively at its high and low levels, substantially equal to positive and negative supply voltages of the pulse amplifier 10. It is noted as described later that the repetition frequency or period of the output signal E2 is definitely determined by the repetition frequency or period of the carrier signal Ec. From the characteristic of the operational amplifier with a feedback, it is seen that a voltage signal E3 at the inverting terminal of the operational amplifier 8 has the same potential as that of the audio signal Ea supplied to the non-inverting terminal thereof. The frequency of the carrier signal Ec is set at a fairly higher frequency than the high frequency of the operating range of the audio signal Ea.

First, it is assumed that the audio signal Ea is at a ground level as shown in FIG. 6(b), and that a triangular wave having a period T is supplied as the carrier signal Ec as shown in FIG. 6(a). In this case, since the voltage of the signal E3 is also at a ground level, if a current having a value i1 flows during the high level duration of the signal E2, from the output of the pulse amplifier 10 through the resistor 13 to the capacitor 12, then a current flowing through the resistor 13 during the low level duration of the signal E2 can be indicated as $-i1$. Generally, the charging and discharging currents i3 and $-i3$ for the capacitor 12 are definitely determined by the combination of the voltage of the signal E2, the voltage appearing at the inverting input terminal of the operational amplifier 8, and the values R1 and R2 of the resistors 15 and 13. Under the assumption that the audio signal Ea is set at a ground level, however, since there is no current flow through the resistor 15, all the current passing through the resistor 13 flows into or out of the capacitor 12. Thus, both charging and discharging currents i3 and $-i3$ have an absolute value of $Vc/R2$. As a result, a voltage signal E4 of a triangular waveform as shown in FIG. 6(c) is obtained at the output terminal of the operational amplifier 8, the slope of the signal E4 being determined by the capacitance value of the capacitor 12 and the charging and discharging currents i3 and $-i3$. Since the currents i3 and $-i3$ have the same absolute value, the slopes of the signal E4 during both high and low level durations (e.g., periods T1 and T2 of FIG. 6(c)) of the signal E2 are the same in gradient and different only in direction. The signal E4 is compared with the carrier signal Ec at the comparator 9 as shown in FIG. 6(d), and the compared result is output as a voltage signal E5 shown in FIG. 6(e) which is in turn amplified by the pulse amplifier 10. The amplified signal, that is, the signal E2, determines the waveform of the signal E4, which means that a negative feedback is effected upon the latter signal E4. It is appreciated that the phase difference of the signal E4 against the carrier signal Ec is definitely determined, although it varies depending upon the waveform of the carrier signal Ec and the slope of the signal E4, and that in this circuit each of the signals E4, E4-Ec, and E5 has the same period T as that of the carrier signal Ec. Consequently, it is seen as shown in FIG. 6(e) that the output signal of the pulse-width modulation circuit 1, and hence the signal E2, is a pulse signal with a period T and a duty ratio of one (1).

Second, the audio signal Ea is assumed to have a positive or higher voltage level than the ground level as shown in FIG. 7(b). Since the signal E3 has the same voltage level as the positive audio signal Ea, a current i2 is caused to flow toward the ground through the resistor 15. While the signal E2 is at its high level, a current (i1−i2) flows through the capacitor 12, and on the other hand while the signal E2 is at its low level, a current −(i1+i2) flows through the capacitor 12. Therefore, the slope of the signal E4 during the high level duration (e.g., period T1 of FIG. 7(c)) is rendered more gentle in gradient than during the low level duration of the signal E2 (e.g., period T2 of FIG. 7(c)). As is similar to the above case, the signal E4 is compared with the carrier signal Ec at the comparator 9 as shown in FIG. 7(d), and the compared result E5 (see FIG. 7(e)) is amplified at the pulse amplifier 10 to generate the signal E2 which has the same period as that of the carrier signal Ec. It is seen from FIG. 7(e) that the signal E2 is a pulse signal with a period T, the time duration during the high level being longer than that during the low level.

Third, the audio signal Ea is assumed to have a negative or lower voltage level than the ground level as shown in FIG. 8(b). Since the signal E3 has the same voltage level as the negative audio signal Ea, a current −i2 is caused to flow toward the ground through the resistor 15. While the signal E2 is at its high level, a current (i1+i2) flows through the capacitor 12, and on the other hand while the signal E2 is at its low level, a current −(i1−i2) flows through the capacitor 12. Therefore, the slope of the signal E4 during the high level duration of the signal E2 (e.g., period T1 of FIG. 8(c)) is rendered more steep in gradient than during the low level duration of the signal E2 (e.g., period T2 of FIG. 8(c)). The signal E4 of a triangular waveform is periodically repeated having the same period as that of the carrier signal Ec, similarly in the above case. It is seen from FIG. 8(e) that the signal E2 is a pulse signal with a period T, the time duration during the high level being shorter than that during the low level.

The relation between the audio signal Ea and the duty ratio of the output signal E2 of the pulse-width modulation circuit 1 will now be explained hereinunder.

Figure 9:
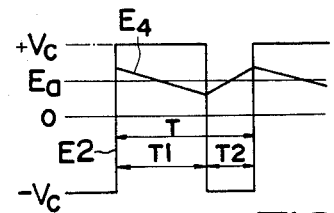
FIG. 9 shows an interrelation between the waveforms of the audio and other signals Ea, E4 and E2 which are plotted along the common time axis.

FIG. 9 shows an interrelation between the waveforms of the audio and other signals Ea, E4 and E2 which are plotted along the common time axis.

It is assumed that a current i3 flows through the capacitor 12 in a direction from the resistor 13 to the output terminal of the operational amplifier 8. The current i3 during the period T1 of FIG. 9, i.e., the current i3 while the signal E2 is at its high level is expressed as $$i3 = \left( \frac{E2 - E3}{R2} - \frac{E3}{R1} \right) \quad (1)$$

$$= \left( \frac{Vc - Ea}{R2} - \frac{Ea}{R1} \right)$$

On the other hand, the current i3, during the period T2 of FIG. 9, i.e., the current i3 while the signal E2 is at its low level is expressed as $$i3 = -\left( \frac{E3 - E2}{R2} + \frac{E3}{R1} \right) \quad (2)$$

-continued $$= -\left( \frac{Vc + Ea}{R2} + \frac{Ea}{R1} \right)$$

The output signal E4 of the operational amplifier 8 must meet the requirements that the signal E4 is always held oscillatory and never goes to divergence, in other words that the signal E4 is a constant successive signal continuously repeated during the operation. Therefore, the electric charges flowing to and out of the capacitor 12 must be equal in the amount during the intervals both at the charging and discharging operations. The following equation with respect to the electric charge amount may accordingly be established.

$$T1 \cdot \left( \frac{Vc - Ea}{R2} - \frac{Ea}{R1} \right) = \quad (3)$$

$$T2 \cdot \left( \frac{Vc + Ea}{R2} + \frac{Ea}{R1} \right)$$

The period T of the carrier signal Ec equals to the summation of the periods T1 and T2 shown in FIG. 9, thus, $$T = T1 + T2 \quad (4)$$

The equation (3) is substituted into the above equation (4), and is rearranged as $$T = T1 \cdot \frac{2R1 \cdot Vc}{R1 \cdot (Vc + Ea) + R2 \cdot Ea} \quad (5)$$

Since the duty ratio D of the signal E2 is given by $$D = (T1/T) \quad (6)$$

Then, from the equation (5) the duty ratio D is expressed in the form of $$D = \frac{R1 \cdot Vc + R1 \cdot Ea + R2 \cdot Ea}{2R1 \cdot Vc} \quad (7)$$

$$= \frac{1}{2} + \left( 1 + \frac{R2}{R1} \right) \cdot \frac{Ea}{2Vc}$$

As seen from the equation (7), in the circuit arrangement of FIG. 5 according to the invention, the duty ratio D of the output signal E2 of the pulse-width modulation circuit 1 is in exactly correct proportion to the amplitude of the audio signal E2, and in addition the gain of pulse-width modulation is determined by the values R2 and R1 of the resistors 13 and 15. As appreciated from the foregoing discussion, it can be understood that the duty ratio D is irrelevant to the waveform of the carrier signal Ec except its period T. Therefore, in the circuit arrangement of FIG. 5, various types of repetition signals, such as a sawtooth wave, a sinusoidal wave and the like, as well as a triangular wave described above, can be used as a carrier signal so long as each repetition signal has a correct and stable period T, regardless of whether it has a non-linear and or asymmetrical characteristic in waveform. Owing to the negative feedback loop including the resistor 13, the audio signal Ea is subjected to negative feedback sufficient for reducing distortion to a large extent, while the carrier signal Ec even with some possible distortion can function to operate in the circuit without giving no distortion influence upon the signal E4.

Figure 10:
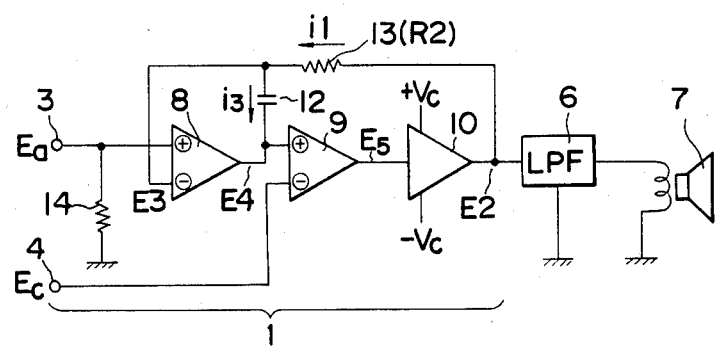
FIGS. 10 and 11 are schematic circuit diagrams of second and third embodiments of the pulse-width modulation circuit according to the invention, which are applied to audio signal amplifiers.

FIG. 10 shows a second embodiment of the pulse-width modulation circuit according to the invention. Identical reference numbers and characters have been used to designate corresponding components and signals of the first embodiment of FIG. 5, and the description thereof has been omitted. A pulse-width modulation circuit 1 of FIG. 10 is identical in the circuit construction with the circuit of the first embodiment of FIG. 5 except that the value R1 of the resistor 15, connected between ground and the inverting input terminal of the operational amplifier 8, is made infinite, that is, the resistor 15 has been deleted therefrom.

In the pulse-width modulation circuit 1 of FIG. 10, the charge and discharge currents i3 and −i3 flowing through the capacitor 12 are determined by the voltage values of the signal E2 and the signal at the inverting input terminal of the operational amplifier 8, and the value R2 of the resistor 13. When the audio signal Ea, to which the voltage at the inverting input terminal of the amplifier 8 follows, goes higher than the ground level, the signal E4 also goes high, accordingly. As a result, during the time the output signal E2 is at its high level, the current i3 is relatively small thereby causing the capacitor 12 to charge slowly, and causing the signal E4 to fall gradually. While on the other hand, during the time the signal E2 is at its low level, the capacitor 12 is allowed this time to discharge quickly, that is, the signal E4 rises rapidly. Contrary to the above, when the audio signal Ea, to which the voltage at the inverting input terminal of the amplifier 8 follows, goes lower than the ground level, the signal E4 also goes low, accordingly. As a result, during the time the output signal E2 is at its high level, the current i3 is relatively large thereby causing the capacitor 12 to charge quickly, and causing the signal E4 to fall rapidly. While on the other hand, during the time the signal E2 is at its low level, the capacitor 12 is allowed this time to discharge slowly, that is, the signal E4 rises slowly.

The signal E4 successively changing in the above manner is then compared with the carrier signal Ec at the comparator 9. Thus, similarly to the first embodiment of FIG. 5, the signal E2 is converted into a pulse signal, having the same period T as the carrier signal Ec and having pulse widths modulated in accordance with the amplitude of the audio signal Ea. The relation between the duty ratio of the output signal E2 of the pulse-width modulation circuit 1 of FIG. 10 and the audio signal Ea can readily be obtained from the circuit analysis of the pulse-width modulation circuit 1 of FIG. 5, when the resistance value R1 is made infinite. Accordingly, from the equation (7), it is also seen that the duty ratio of the signal E2 is in correct proportion to the amplitude of the audio signal Ea.

Figure 11:
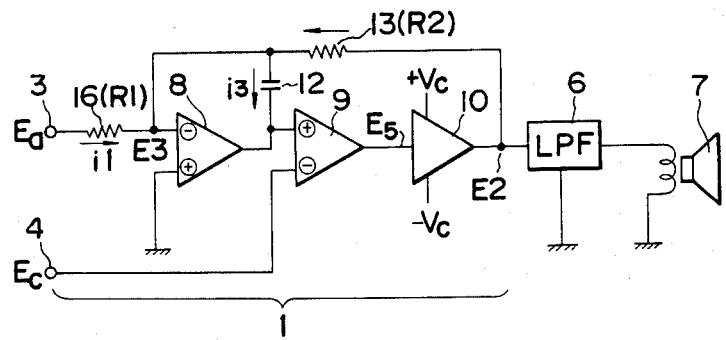

FIG. 11 shows a third embodiment of the pulse-width modulation circuit according to the invention. Identical reference numbers and characters have been used to designate corresponding components and signals of the first embodiment of FIG. 5, and the description thereof has been omitted. The pulse-width modulation circuit 1 of FIG. 11 is constructed such that the operational amplifier 8 of FIG. 5 is used as an inverting amplifier. The inverting input terminal of the operational amplifier 8 is connected to the input terminal 3 through a resistor 16 (value R1) and also to the junction point between the capacitor 12 and the resistor 13, while the non-inverting input terminal is connected to ground.

In the embodiment of FIG. 11 the charge and discharge currents i3 and −i3 flowing through the capacitor 12 are determined by the voltage values of the signal E2 and audio signal Ea, and the resistance values R2 and R1 of the resistors 13 and 16. The ratio of charge to discharge intervals of the capacitor 12 varies with the amplitude of the audio signal Ea. As a result, similarly to the aforementioned embodiments, a pulse signal E2 can be obtained, the duty ratio of which is varied in accordance with the amplitude or voltage level of the audio signal Ea.

The relation between the audio signal Ea and the duty ratio of the pulsed signal output E2 will be discussed in a similar way as in the embodiment of FIG. 5.

The inverting input of the operational amplifier 8 can be considered as a virtual ground from the viewpoint of the principle of the operational amplifier, and the signal E3 is assumed now at a ground level. Then, the charge current i3 flowing through the capacitor 12, during the time the signal E2 is being at its high level, is $i3 = Ea/R1 + Bc/R2$ while the discharge current flowing through the capacitor 12 during the low level of the signal E2 is $i3 = Vc/R2 - Ea/R2$ As similar to the first embodiment of FIG. 5, the output signal E4 of the operational amplifier 8 must meet the requirements that the signal E4 is always held oscillatory and never goes to divergence, in other words that the signal E4 is a constant successive signal continuously repeated during the operation. Therefore, the electrical charges flowing to and out of the capacitor 12 must be equal in the amount during the intervals both at the charging and discharging operations.

The following equation of the electric charge amount may accordingly be established.

$$\left(\frac{Ea}{R1} + \frac{Vc}{R2}\right) \cdot T1 = \left(\frac{Vc}{R2} - \frac{Ea}{R1}\right) \cdot T2 \tag{8}$$

wherein T1 and T2 respectively represent the periods during which the signal E2 is at its high and low levels, similarly as in the embodiment of FIG. 5.

From the equation (8) above, the duty ratio D of the signal E2 is given by $$D = \frac{1}{1 + \frac{T2}{T1}} = \frac{R1 \cdot Vc - R2 \cdot Ea}{2R1 \cdot Vc} = \frac{1}{2} - \frac{Ea}{2vc} \cdot \frac{R2}{R1} \tag{9}$$

As is apparent from the equation (9), the duty ratio D of the signal E2 is in correct proportion to the amplitude of the audio signal Ea, and the modulation gain is determined by the resistance values R2 and R1 of the resistors 13 and 16.

The third embodiment of FIG. 11 can also enjoy similar effects obtained by the embodiments of FIGS. 5 and 10. The differences between the former and latter embodiments reside in that in the third embodiment of FIG. 11 the pulse output E2 is in inverse relation to the audio input Ea, that the input impedance of the pulse-width modulation circuit 1 of the first and second embodiments of FIGS. 5 and 10 is determined by the input impedance of the operational amplifier 8, while the input impedance of the third embodiment of FIG. 11 is determined by the resistance value R1 of the resistor 16.

What is claimed is:

1. A pulse-width modulation circuit by which an input signal is pulse-width modulated by means of a carrier signal comprising:

first amplifier means having inverting and non-inverting input terminals and a first output terminal, said input signal being applied to one of said inverting and non-inverting input terminals;

capacitor means connected between said output and inverting input terminals;

comparator means having first and second input terminals and a second output terminal, an output signal from said first amplifier means being applied to said first input terminal and said carrier signal being applied to said second input terminal, said comparator means comparing said output signal from said first amplifier means with said carrier signal to deliver at said second output terminal a pulse signal; and feedback means for feeding back said pulse signal from said comparator means to said inverting input terminal of said first amplifier means, wherein said pulse signal is a pulse-width modulated signal of said input signal.

2. A pulse-width modulation circuit as claimed in claim 1, in which said first amplifier means is constructed of a non-inverting amplifier arrangement, and said input signal is applied to said non-inverting input terminal.

3. A pulse-width modulation circuit as claimed in claim 2, in which said inverting input terminal of said first amplifier means is grounded through first impedance means.

4. A pulse-width modulation circuit as claimed in claim 1, in which said first amplifier means is constructed of an inverting amplifier arrangement, and said input signal is applied to said inverting input signal.

5. A pulse-width modulation circuit as claimed in claim 4, in which said inverting input terminal of said first amplifier means is connected to an input terminal of the pulse-width modulation circuit through an impedance means.

6. A pulse-width modulation circuit as claimed in claim 1, further comprising second amplifier means which pulse-amplifies said pulse signal from said comparator means to deliver a pulse-amplified signal, wherein said feedback means feeds back said pulse-amplified signal from said second amplifier means to said inverting input terminal of said first amplifier means and wherein said pulse-amplified signal is a modulated signal of said input signal.

7. A pulse-width modulation circuit as claimed in claim 1, in which said pulse signal of a pulse-width modulated signal is demodulated by a low-pass filter to be delivered to a load.

* * * * *